(12) United States Patent
Lee et al.

(10) Patent No.: US 11,664,469 B2
(45) Date of Patent: May 30, 2023

(54) SOLAR CELL HAVING EDGE COLLECTION ELECTRODE AND SOLAR CELL MODULE COMPRISING SAME

(71) Applicant: Hyundai Energy Solutions Co., Ltd., Seongnam-si (KR)

(72) Inventors: Min Su Lee, Seongnam-si (KR); Hoon Oh, Seongnam-si (KR); Do Hyeon Kyeong, Seongnam-si (KR); Tae Jun Kim, Seongnam-si (KR); Hyun Shin Kang, Seongnam-si (KR); Hee Jin Maeng, Seongnam-si (KR)

(73) Assignee: HD Hyundai Energy Solutions Co., Ltd.

( * ) Notice: Subject to any disclaimer, the term of this patent is extended or adjusted under 35 U.S.C. 154(b) by 54 days.

(21) Appl. No.: 16/770,191

(22) PCT Filed: Dec. 7, 2017

(86) PCT No.: PCT/KR2017/014323
§ 371 (c)(1),
(2) Date: Jun. 5, 2020

(87) PCT Pub. No.: WO2019/112091
PCT Pub. Date: Jun. 13, 2019

(65) Prior Publication Data
US 2020/0295205 A1    Sep. 17, 2020

(51) Int. Cl.
*H01L 31/0224* (2006.01)
*H01L 31/05* (2014.01)
*H01L 31/02* (2006.01)

(52) U.S. Cl.
CPC .. *H01L 31/022433* (2013.01); *H01L 31/0201* (2013.01); *H01L 31/0508* (2013.01)

(58) Field of Classification Search
CPC . H01L 31/05; H01L 31/0504; H01L 31/0508; H01L 31/022425; H01L 31/022433; H01L 31/0201
See application file for complete search history.

(56) References Cited

U.S. PATENT DOCUMENTS 9,806,206 B2    10/2017    Martin et al.
10,879,411 B2    12/2020    Oh et al.
(Continued)

FOREIGN PATENT DOCUMENTS

JP    2016-100605 A    5/2016
KR    1020100090316 A    8/2010
(Continued)

*Primary Examiner* — Christina Chern
(74) *Attorney, Agent, or Firm* — Blank Rome LLP

(57) ABSTRACT

The present invention relates to a solar cell having an edge collecting electrode and a solar cell module comprising the same, the solar cell being capable of preventing a cell crack phenomenon caused by an interconnector and improving an adhesive characteristic of the interconnector by dividing a planar area of the solar cell into a main area and an edge area and positioning the outermost contact point of the interconnector at a boundary between the main area and the edge area, and being capable of improving carrier collecting efficiency by arranging, in the edge area, the edge collecting electrode and the branched electrode which are physically separated from the interconnector.

16 Claims, 12 Drawing Sheets

(56) References Cited

U.S. PATENT DOCUMENTS

| | | | |
|---|---|---|---|
| 2016/0093752 A1 | 3/2016 | Kim et al. | |
| 2016/0322527 A1 | 11/2016 | Hwang et al. | |
| 2017/0095871 A1* | 4/2017 | Hwang | B23K 3/04 |
| 2017/0243992 A1* | 8/2017 | Rostan | H01L 31/0504 |
| 2021/0135031 A1* | 5/2021 | Yoon | H01L 31/0504 |

FOREIGN PATENT DOCUMENTS

| | | |
|---|---|---|
| KR | 101138174 B1 | 4/2012 |
| KR | 101462699 B1 | 11/2014 |
| KR | 1020160038717 A | 4/2016 |
| KR | 1020160129670 A | 11/2016 |
| KR | 1020170063663 A | 6/2017 |
| KR | 1020170091571 A | 8/2017 |
| WO | WO-2008115309 A2 | 9/2008 |
| WO | WO-2016051251 A1 | 4/2016 |
| WO | WO-2018155752 A1 * 8/2018 ......... H01L 31/0201 |

\* cited by examiner

SOLAR CELL HAVING EDGE COLLECTION ELECTRODE AND SOLAR CELL MODULE COMPRISING SAME

BACKGROUND OF THE INVENTION

1. Field of the Invention

The technology disclosed in this specification relates to a solar cell having an edge collecting electrode and a solar cell module including the same, and more specifically, to a solar cell having an edge collecting electrode and a solar cell module including the same, the solar cell being capable of preventing a cell crack phenomenon caused by an interconnector and improving an adhesive characteristic of the interconnector by dividing a planar area of the solar cell into a main area and an edge area and positioning the outermost contact point of the interconnector at a boundary between the main area and the edge area, and being capable of improving carrier collecting efficiency by arranging, in the edge area, the edge collecting electrode which is physically separated from the interconnector and providing branched electrodes connected to a bus electrode (at least one of a bus bar electrode and a conductive pad) and disposed to be partially or entirely located in the edge area.

2. Description of the Related Art

A solar cell module is a device that receives solar light and perform photoelectric transformation thereto, and includes a plurality of solar cells. Each solar cell of the solar cell module may be referred to as a p-n junction diode.

The process of transforming solar light into electricity by the solar cell, so-called a photoelectric transformation process, is as follows. If solar light is input to a p-n junction of the solar cell, electron-hole pairs are generated, and electrons are transferred to an n-type semiconductor layer and holes are transferred to a p-type semiconductor layer by an electric field, thereby generating a photovoltaic power between the p-n junctions. In this state, if a load or system is connected to both ends of the solar cell, a current flows to produce electricity. A front electrode and a back electrode for collecting electrons and holes are respectively provided to a front surface and a rear surface of the solar cell.

Meanwhile, the plurality of solar cells of the solar cell module are electrically connected to each other. For example, a front electrode 111 of a first solar cell 110 is connected to a back electrode 122 of a neighboring second solar cell 120. The conductor that electrically connects the front electrode 111 of the first solar cell 110 and the back electrode 122 of the second solar cell 120 is generally referred to as an interconnector 130 (see FIG. 1).

The interconnector that electrically connects neighboring solar cells is made of a conductor with a certain width and thickness, and a common interconnector is also referred to as a ribbon since it is shaped like a ribbon to connect the neighboring solar cells.

The ribbon-type interconnector (hereinafter, referred to as a ribbon interconnector) has a predetermined width and thickness as described above, for example a width of about 1.5 mm and a thickness of about 270 µm, so that a certain area of the solar cell is inevitably covered by the interconnector. Since the solar cell is a device that receives solar light and transforms it into electricity, if the light receiving area of the solar cell is reduced, it means a decrease in photoelectric transformation efficiency.

In order to solve the reduction of the light receiving area by the interconnector and to improve the efficiency of the solar cell, the research for replacing the ribbon interconnector with a wire-type interconnector (hereinafter, referred to as a wire interconnector) are being actively conducted. The wire interconnector method is a method of connecting electrodes of neighboring solar cells using a conductive wire having a diameter of about 200 to 600 µm.

The wire interconnector method may minimize the reduction of the light receiving area by the interconnector since the width (diameter) of the conductor is significantly smaller than the ribbon interconnector method. Also, since the reduction of the light receiving area by the interconnector is small, a larger number of interconnectors may be disposed in the solar cell in comparison to the ribbon interconnector method, thereby improving the efficiency of the solar cell.

Meanwhile, in connecting the front electrode on the front surface of the first solar cell and the back electrode on the rear surface of the second solar cell, the interconnector is bent between the first solar cell and the second solar cell in both the ribbon interconnector method and the wire interconnector method. However, in the bent region, the first solar cell and the second solar cell that come into contact with the interconnector may have a high possibility of micro cracks caused by the interconnector. In the EL (Electroluminescence) image of FIG. 10, it may be found that cracks (dotted display parts) are generated at edges of the solar cell. Also, it should be noted that the adhesion between the interconnector and the electrode is weakened due to bending.

In both the ribbon interconnector method and the wire interconnector method, the cell cracking phenomenon and the weakening of the adhesive force with the outermost electrode as described above may occur. However, since the wire interconnector method has more interconnectors than the ribbon interconnector method, the above problems may occur more frequently in the wire interconnector method.

RELATED PATENT LITERATURE

Korean Patent No. 1138174

SUMMARY OF THE INVENTION

This disclosure is directed to providing a solar cell having an edge collecting electrode and a solar cell module including the same, which may prevent a cell crack phenomenon caused by an interconnector and improve an adhesive characteristic of the interconnector by dividing a planar area of the solar cell into a main area and an edge area and positioning the outermost contact point of the interconnector at a boundary between the main area and the edge area, and may improve carrier collecting efficiency by arranging, in the edge area, the edge collecting electrode which is physically separated from the interconnector and providing branched electrodes connected to a bus electrode (at least one of a bus bar electrode and a conductive pad) and disposed to be partially or entirely located in the edge area.

In one general aspect, there is provided a solar cell, comprising: a semiconductor substrate having a main area and an edge area; a plurality of finger electrodes provided on any one of a front surface and a rear surface of the substrate and arranged in the main area so as to be spaced apart in parallel; a bus electrode arranged in a direction crossing the finger electrode and connected to an interconnector that electrically connects neighboring solar cells; a plurality of edge collecting electrodes provided in the edge area; and branched electrodes partially or entirely located in the edge area and connected to the bus electrode, wherein the edge area is provided at one end side or both end sides of the substrate, an arrangement direction of the plurality of edge collecting electrodes differs from an arrangement direction of the plurality of finger electrodes, and the plurality of edge collecting electrodes are electrically connected to the bus electrode through at least one finger electrode selected from the plurality of finger electrodes and at least one of the branched electrodes.

In another aspect, there is also provided a solar cell module, comprising: a first solar cell and a second solar cell arranged adjacent to each other; and an interconnector configured to electrically connect a conductive pad at a front surface of the first solar cell and a conductive pad at a rear surface of the second solar cell, wherein the first solar cell or second solar cell includes a semiconductor substrate having a main area and an edge area, a plurality of finger electrodes provided on any one of a front surface and a rear surface of the substrate and arranged in the main area so as to be spaced apart in parallel, a bus electrode arranged in a direction crossing the finger electrode and connected to an interconnector that electrically connects neighboring solar cells, a plurality of edge collecting electrodes provided in the edge area, and branched electrodes partially or entirely located in the edge area and connected to the bus electrode, wherein the edge area is provided at one end side or both end sides of the substrate, an arrangement direction of the plurality of edge collecting electrodes differs from an arrangement direction of the plurality of finger electrodes, and the plurality of edge collecting electrodes are electrically connected to the bus electrode through at least one finger electrode selected from the plurality of finger electrodes and at least one of the branched electrodes.

Advantageous Effects of the Invention

The solar cell having an edge collecting electrode and the solar cell module including the same as disclosed in this specification give the following effects.

Since the outermost contact point of the interconnector is located at an inner side of the substrate as much as the edge area from the edge of the substrate, it is possible to prevent cracking by the interconnector and improve the adhesion of the interconnector.

In addition, since the edge collecting electrode disposed in a direction crossing the finger electrode in the main area is provided in the edge area, it is possible to guide the arrangement of the interconnector and improve the carrier collection efficiency.

Additionally, by electrically connecting the plurality of edge collecting electrodes provided in the edge area to the outermost conductive pad through the branched electrode, the carrier travel distance in the edge area may be shortened to prevent carriers from being recombined and disappearing.

DETAILED DESCRIPTION OF THE PREFERRED EMBODIMENTS

Figure 1:
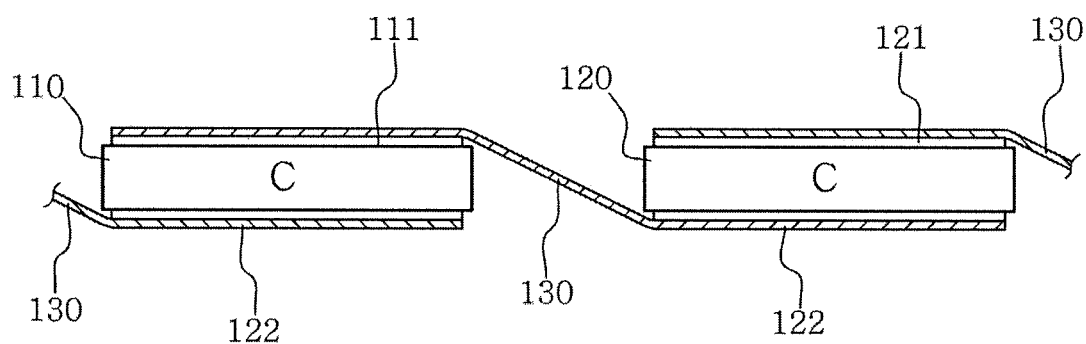
FIG. 1 is a diagram showing a general solar cell module.

In describing the embodiments disclosed in this specification, if it is determined that a detailed description of related known configurations or functions may obscure the gist of this specification, the detailed description may be omitted.

It should be noted that technical terms used in this specification are only used to describe specific embodiments and are not intended to limit the scope of the technology disclosed in this specification. In addition, the technical terms used in this specification should be interpreted as meanings generally understood by those of ordinary skill in the field to which the technology disclosed in this specification belongs, unless otherwise defined in this specification, and they should not be interpreted as a comprehensive meaning or an excessively reduced meaning. In addition, when any technical term used in this specification is an incorrect technical term that does not accurately represent the idea of the technology disclosed in this specification, it should be understood as being replaced by a technical term that can be correctly understood by those skilled in the art. In addition, general terms used in this specification should be interpreted as defined in the dictionary or according to the context before and after, and should not be interpreted as an excessively reduced meaning.

The expressions "include", "may include", and the like used in this specification indicate the existence of a corresponding function, operation or component disclosed therein, and do not limit one or more additional functions, operations or components. Also, in this specification, the terms "configured", "include" or "have" are intended to indicate the presence of features, numbers, steps, actions, components, parts, or combinations thereof described in the specification, and should not be understood to exclude the presence or possibility of addition of one or more other features, numbers, steps, actions, components, parts, or combinations thereof in advance. In other words, the terms should not be construed to essentially include all of various components or various steps described in the specification, and it should be interpreted that some of those components or steps may not be included or additional components or steps may be further included.

In addition, the terms "module" and "unit" used in the terms of components disclosed in this specification are given or mixed only considering the ease of writing the specification, and do not have distinct meanings or roles in themselves.

Also, terms including ordinal numbers such as "first" and "second" used in this specification may be used to describe various components, but the components should not be limited by the terms. The terms are only used to distinguish one component from another. For example, a first component may be referred to as a second component without departing from the scope of the present disclosure, and similarly, the second component may also be referred to as the first component.

Hereinafter, embodiments disclosed in this specification will be described in detail with reference to the accompanying drawings, but the same or similar elements will be designated by the same reference numbers regardless of reference numerals, and redundant descriptions thereof will be omitted.

In addition, in describing the technology disclosed in this specification, when it is determined that a detailed description of related known technologies may obscure the gist of the technology disclosed in this specification, the detailed description will be omitted. In addition, it should be noted that the accompanying drawings are only for facilitating understanding of the scope of the technology disclosed in this specification, and should not be interpreted as limiting the scope of the technology by the accompanying drawings.

Interconnector

An interconnector may mean a conductor that connects electrodes of neighboring solar cells, for example an electrode on a front surface of a first solar cell and an electrode on a rear surface of the second solar cell.

The interconnector may be classified into a ribbon interconnector and a wire interconnector depending on the geometric shape. The ribbon interconnector may have a ribbon shape with a certain width and thickness, and the wire interconnector may have a circular wire shape with a constant diameter or a wire shape with different widths and thicknesses.

In connecting electrodes of neighboring solar cells, the interconnector is bent in the space between a solar cell and a solar cell. Due to the bending of the interconnector, a crack may occur at an end of the solar cell that contacts the bending point of the interconnector, or the interconnector may be attached to the bus bar and detached therefrom at the end of the solar cell. Such defects may more frequently occur in the wire interconnector method because the number of interconnectors is larger in the wire interconnector method than in the ribbon interconnector method.

The cell cracking phenomenon and the poor adhesion phenomenon caused by the bending of the interconnector are more serious as the length of the interconnector from an outermost pad on the front surface of the first solar cell to an outermost pad on the rear surface of the second solar cell is shorter and the thickness of the interconnector in the vertical direction is greater at the bending point of the interconnector. If the interconnector has a short length and a large thickness, a greater bending stress is generated at the bending point of the interconnector. The bending stress may be transmitted to the end of the solar cell in contact with the bending point of the interconnector, which may cause further cracking at the end of the solar cell and cause the interconnector to be attached and detached more easily at the end of the solar cell.

In order to solve this problem, it may be considered to reduce the thickness of the interconnector. However, if the thickness of the interconnector is reduced, the resistance applied to the interconnector is increased. As an alternative, it is possible to increase the length of the interconnector from the outermost pad on the front surface of the first solar cell to the outermost pad on the rear surface of the second solar cell. Specifically, it is a method of moving the outermost pads on the front and rear surfaces of the solar cell to an inner area of the solar cell.

Meanwhile, if the outermost contact point of the interconnector and the electrode moves away from an upper edge of the solar cell to the inner area of the solar cell, this means that there is no solar cell electrode between the outermost contact point and the upper edge of the solar cell. Through this, it is possible to solve the cell cracking phenomenon and the weakening of the adhesion, but there may be a problem that the carrier collection efficiency is deteriorated due to the absence of a solar cell electrode between the outermost contact point and the upper edge of the solar cell.

Edge Collecting Electrode and Branched Electrodes

An edge collecting electrode disclosed in this specification may be applied to the solar cell, which may enhance the carrier collection efficiency while improving the cell cracking phenomenon by the interconnector and the weakening of the adhesion between the interconnector and the electrode as described above, and a solar cell module using the same.

Specifically, the technique disclosed in this specification solves the cell cracking phenomenon and the weakening of the adhesive force by moving the outermost contact point to the inner area of the solar cell, and also prevents deterioration of the solar cell efficiency such as the carrier collection efficiency by providing an edge collecting electrode in an area (an edge area, explained later) between the outermost contact point and the edge of the solar cell and disposing an interconnector between the edge collecting electrodes.

In addition, the technique disclosed in this specification proposes a technique capable of suppressing that the carrier is recombined and disappear by disposing a plurality of edge collecting electrodes in an edge area and shortening a carrier travel distance in the edge area through branched electrodes connected to the bus electrode and arranged to be partially or entirely located in the edge area.

Here, the bus electrode may be disposed in a direction crossing the finger electrode in a main area, explained later, and may be connected to an interconnector that electrically connects neighboring solar cells, and may be configured to include a bus bar electrode formed by successively disposing electrodes in a direction crossing the finger electrode and at least one of a plurality of conductive pads arranged so as to be spaced apart in a direction crossing the finger electrode.

In addition, the interconnector applied to the solar cell or the solar cell module disclosed in this specification is not limited to the shape. A wire interconnector may be applied in a preferred configuration, but a ribbon interconnector may also be applied.

The solar cell according to the technique disclosed in this specification may include a semiconductor substrate having a main area and an edge area, a plurality of finger electrodes provided on any one of a front surface and a rear surface of the substrate and arranged in the main area so as to be spaced apart in parallel, a bus electrode arranged in a direction crossing the finger electrode and connected to an interconnector that electrically connects neighboring solar cells, a plurality of edge collecting electrodes provided in the edge area, and branched electrodes partially or entirely located in the edge area and connected to the bus electrode.

In addition, the solar cell module according to the technique disclosed in this specification may include a first solar cell and a second solar cell arranged adjacent to each other, and an interconnector configured to electrically connect a conductive pad at a front surface of the first solar cell and a conductive pad at a rear surface of the second solar cell, and the first solar cell or second solar cell may include a semiconductor substrate having a main area and an edge area, a plurality of finger electrodes provided on any one of a front surface and a rear surface of the substrate and arranged in the main area so as to be spaced apart in parallel, a bus electrode arranged in a direction crossing the finger electrode and connected to an interconnector that electrically connects neighboring solar cells, a plurality of edge collecting electrodes provided in the edge area, and branched electrodes partially or entirely located in the edge area and connected to the bus electrode.

In the solar cell and the solar cell module described above, the edge area may be provided at one end side or both end sides of the substrate, an arrangement direction of the plurality of edge collecting electrodes may differ from an arrangement direction of the plurality of finger electrodes, and the plurality of edge collecting electrodes may be electrically connected to the bus electrode through at least one finger electrode selected from the plurality of finger electrodes and at least one of the branched electrodes.

In addition, the bus electrode may be configured to include a bus bar electrode formed by successively disposing electrodes in a direction crossing the finger electrode and at least one of a plurality of conductive pads arranged so as to be spaced apart in a direction crossing the finger electrode.

In addition, the plurality of conductive pads may be arranged to make a row in a direction orthogonal to the collection electrode.

In addition, the plurality of conductive pads may be arranged so as to be spaced apart on a finger electrode in a region where an interconnector for electrically connecting neighboring solar cells is disposed, and the bus bar electrode may be provided between the plurality of conductive pads.

In addition, the bus bar electrode may be provided in a direction orthogonal to the plurality of collection electrodes, and the conductive pad may be provided on a bus bar electrode at a point where the bus bar electrode and the finger electrode intersect.

In addition, the bus bar electrode may be provided between the conductive pads, and the finger electrode and the bus bar electrode may be connected to the conductive pad.

In addition, the selected at least one finger electrode may be selected from three finger electrodes located at an outermost side of the main area.

In addition, the plurality of edge collecting electrodes may be arranged orthogonal to the plurality of finger electrodes.

In addition, the interconnector for electrically connecting neighboring solar cells may be disposed between the edge collecting electrodes.

In addition, among the plurality of edge collecting electrodes, an edge collecting electrode located at an edge portion of the solar cell may have a different length from edge collecting electrodes located in other regions.

In addition, at least one of the plurality of edge collecting electrodes may be connected to a conductive pad located at an outermost side of the main area.

In addition, the interconnector may be a ribbon-type interconnector or a wire-type interconnector.

In addition, the branched electrodes may be disposed to cross the plurality of edge collecting electrodes.

In addition, the edge collecting electrode may include a first edge collecting electrode and a second edge collecting electrode, and the first edge collecting electrode may be located below the branched electrodes, and the second edge collecting electrode may be located above the branched electrodes.

In addition, the first edge collecting electrode may be connected to at least one of the branched electrode and the finger electrode.

In addition, the second edge collecting electrode may be connected to the branched electrodes.

In addition, the number of the first edge collecting electrodes may be different from the number of the second edge collecting electrodes.

In addition, the number of the first edge collecting electrodes may be smaller than the number of the second edge collecting electrodes.

In addition, the width between the first edge collecting electrode and the first edge collecting electrode may be different from the width between the second edge collecting electrode and the second edge collecting electrode.

More specifically, the edge collecting electrode according to the technology disclosed in this specification will be described below.

First, the edge collecting electrode may be provided in the edge area of the semiconductor substrate. Alternatively, the edge collecting electrode may be provided at one end side or both end sides of a semiconductor substrate (or, a substrate).

The semiconductor substrate is divided into an edge area and a main area. The edge area may mean an end portion (or, an edge portion) of a solar cell (or, a semiconductor substrate) provided to one side or both sides of the main area.

In another sense, the main area may mean a region in which the plurality of finger electrodes are located, and the edge area may mean a region in which the edge collecting electrode is located. Alternatively, the edge area may mean one end portion or both end portions (or, edge portions) of a solar cell (or, a semiconductor substrate) in which the plurality of finger electrodes are not located.

In still another sense, the main area means a region in which a bus electrode (or, a bus bar, a bus bar electrode) is located, and the edge area is an end portion (or, an edge portion) of a solar cell (or, a semiconductor substrate) provided to one side or both sides of the main area. Alternatively, the edge area may mean one end portion or both end portions (or, edge portions) of a solar cell (or, a semiconductor substrate) in which the bus electrode is not located.

Here, the bus electrode may serve to collect charges through at least one of the plurality of finger electrodes and the edge collecting electrode.

In addition, the bus electrode may be disposed in a direction crossing the finger electrode and connected to an interconnector that electrically connects neighboring solar cells.

The term 'direction crossing' a specific electrode or 'crossing direction' used in this specification may generally mean a direction orthogonal to the specific electrode, but it may mean a direction arranged not in parallel but at an angle such as a diagonal direction to the extent that the technology disclosed in this specification can be applied.

The bus electrode according to an embodiment disclosed in this specification may include at least one of a bus bar electrode formed by successively disposing electrodes in a direction crossing the finger electrode and a plurality of conductive pads arranged so as to be spaced apart in a direction crossing the finger electrode.

The edge collecting electrode according to the technology disclosed in this specification may be basically located in the edge area to collect electric charges.

In addition, a plurality of edge collecting electrodes are spaced apart from each other and located in the edge area. Here, the interconnector may be disposed between the arranged edge collecting electrodes to prevent the cell crack phenomenon by the interconnector and improve the adhesive properties of the interconnector.

In another sense, the arrangement direction of the edge collecting electrodes may differs from the arrangement direction of the finger electrodes to provide a space in which the interconnector is disposed. For example, the arrangement direction of the edge collecting electrodes may be an orthogonal direction crossing the finger electrode or an inclined direction such as a diagonal line within a range that can provide a space in which the interconnector is disposed.

As described above, the interconnector may be disposed between the edge collecting electrodes. Therefore, an intermediate electrode capable of transferring electric charges collected from the edge collecting electrode to the interconnector may be required. This is because the edge collecting electrode and the interconnector do not physically directly contact due to the nature of the arrangement direction, so an electrode that transfers charges therebetween is required.

According to the technique disclosed in this specification, the finger electrode located in the main area may act as the intermediate electrode. Therefore, in this case, the edge collecting electrode may be connected to at least one finger electrode selected from the plurality of finger electrodes located in the main area.

In addition, according to the technique disclosed in this specification, the branched electrodes partially or entirely located in the edge area and connected to the bus electrode may serve as the intermediate electrode.

Accordingly, the plurality of edge collecting electrodes located in the edge area may be electrically connected to the bus electrode through at least one finger electrode selected from the plurality of finger electrodes and at least one of the branched electrodes.

Hereinafter, the branched electrode disclosed in this specification will be described in detail.

Figure 2A:
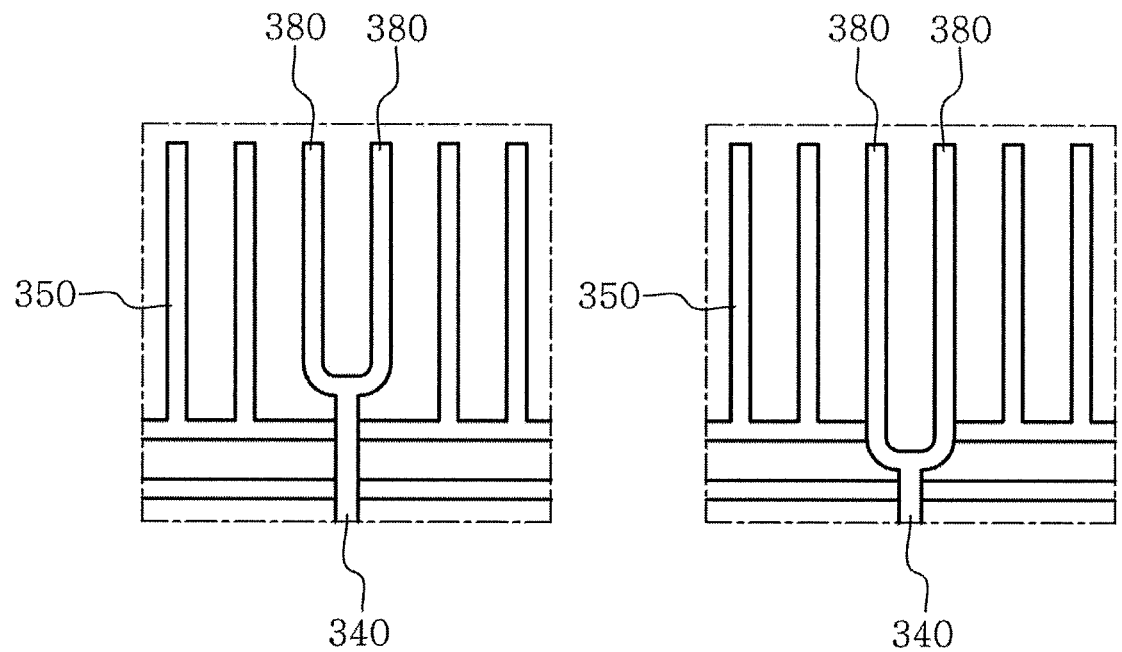
FIGS. 2A to FIG. 2C are reference views showing an embodiment of branched electrodes disclosed in this specification.
Figure 2B:
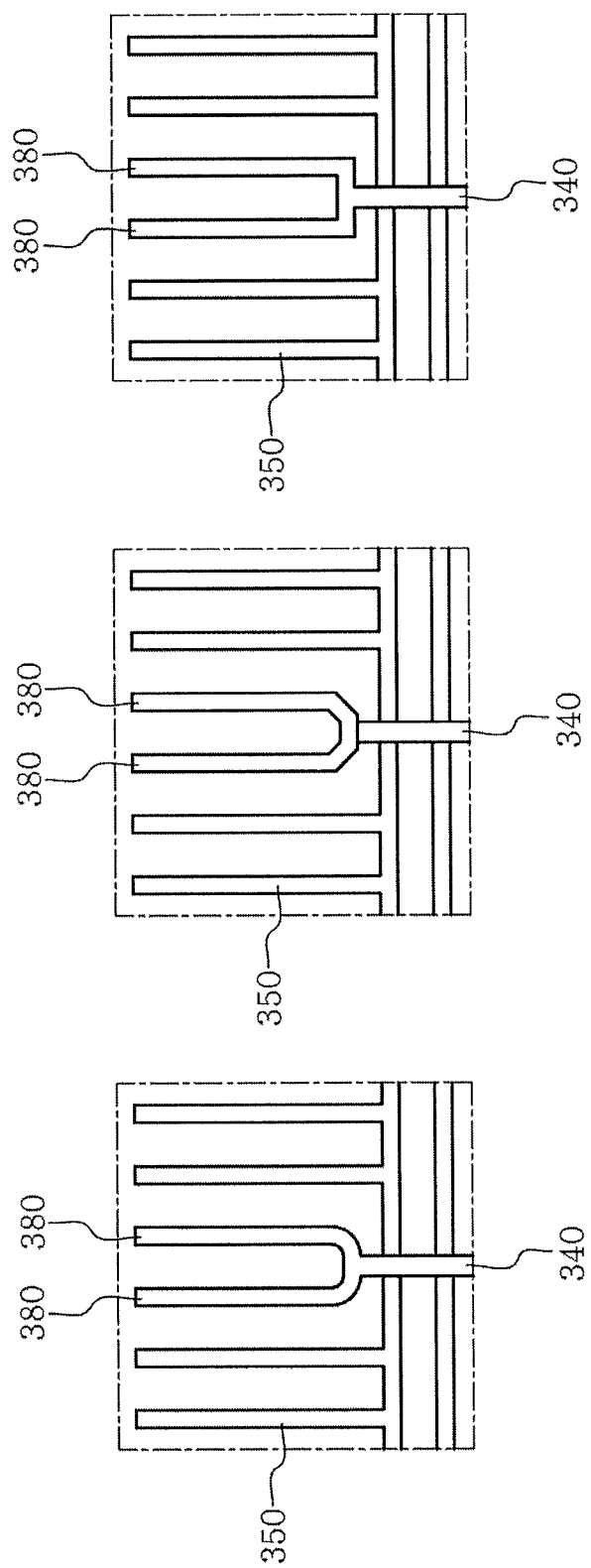
Figure 2C:
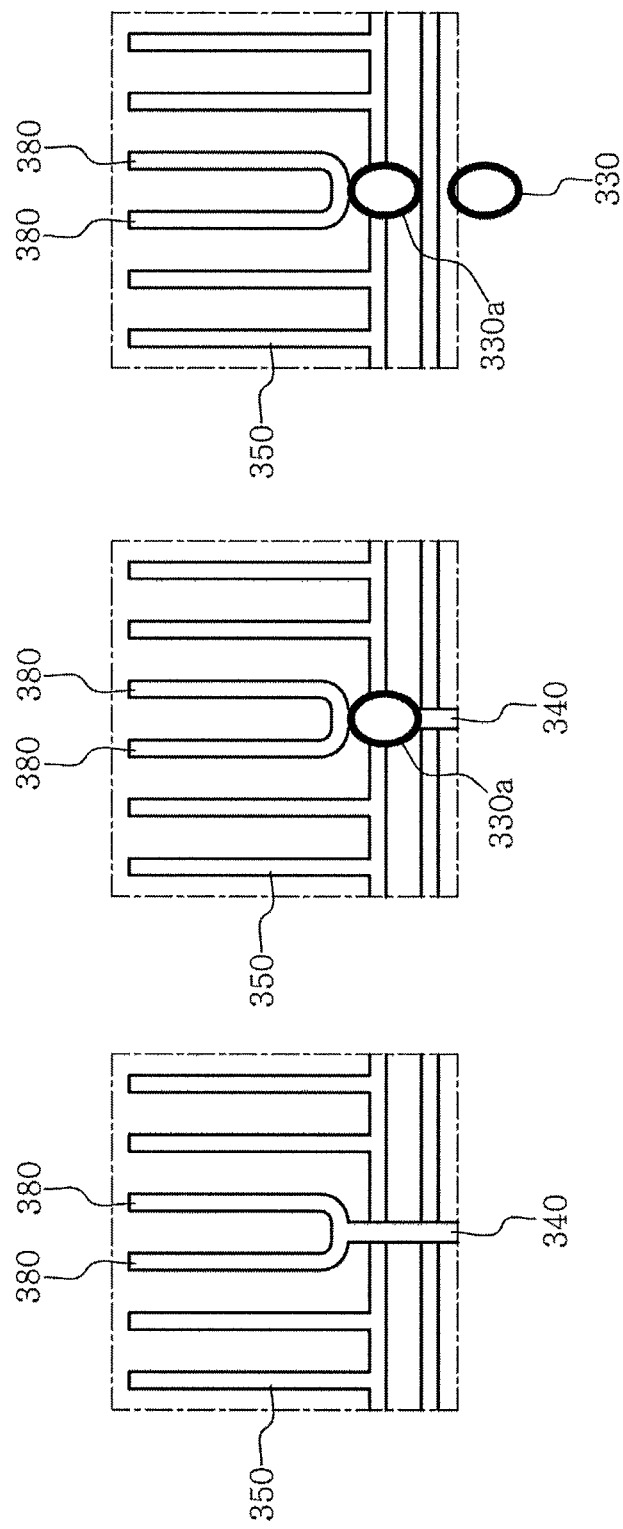

FIGS. 2A to FIG. 2C are reference views showing an embodiment of a branched electrode disclosed in this specification.

FIGS. 2A to FIG. 2C are depicted based on the definition of the branched electrode disclosed in this specification rather than the role of the intermediate electrode described above, and particularly shows a case where the branched electrode is located between the edge collecting electrodes 350. The case where the branched electrode serves as an intermediate electrode will be described later in detail with reference to FIGS. 3 to 6.

Referring to FIG. 2A, the branched electrode 380 disclosed in this specification may be partially or entirely located in the edge area described above. The left figure of FIG. 2A shows the case where the branched electrode 380 is entirely located in the edge area, and the right figure of FIG. 2A shows the case where the branched electrode 380 is partially out of the edge area. In addition, FIG. 2A shows an embodiment in which the branched electrode 380 is connected to the bus bar electrode 340 when the bus electrode is configured using a bus bar electrode 340.

FIG. 2B shows various embodiments of the branched electrode 380, and the connecting portion of the branched electrode 380 and the outermost conductive pad 330a may be designed to be round (the left figure of FIG. 2B), diagonal (the center figure of FIG. 2B), rectangular (the right figure of FIG. 2B), or the like. Similar to FIG. 2A, FIG. 2B also shows an embodiment in which the branched electrode 380 is connected to the bus bar electrode 340 when the bus electrode is configured using a bus bar electrode 340.

FIG. 2C shows embodiments in which the branched electrode is connected to various types of bus electrodes. That is, the branched electrode may be connected to various types of bus electrodes, for example in a case where only the bus bar electrode 340 is present (the left figure of FIG. 2C), in a case where the bus bar electrode 340 and the conductive pad (only an outermost conductive pad 330a is shown) are present (the center figure of FIG. 2C), and in a case where only the conductive pad 330 is present (the right figure of FIG. 2C).

Also, FIGS. 2A to 2C show a case where the branched electrode 380 is connected to the outermost conductive pad 330a when the bus electrode includes the conductive pad.

In summary, the branched electrode 380 disclosed in this specification may be characterized in that the branched electrode 380 is partially or entirely located in the edge area and connected to the bus electrode.

In the case of FIGS. 2A to 2C, the branched electrodes 380 are disposed between the edge collecting electrodes 350, and the branched electrodes 380 may also have a certain interval therebetween (equal to or similar to the gap between the edge collecting electrodes 350) so that the interconnector is disposed between the branched electrodes 380. In this case, the branched electrodes 380 may function similar to the edge collecting electrode 350 to solve the cell cracking phenomenon and the weakened adhesion between the interconnector and the electrode caused by the interconnector. In addition, in this case, the edge collecting electrode 350 may transfer the collected charges to the bus electrode by using the finger electrode as an intermediate electrode.

Also, as described above, due to the characteristics of the branched electrode, the edge collecting electrode may transfer the collected charges to the bus electrode by using the branched electrode as another intermediate electrode (see FIGS. 3 to 6). This will be described later in detail.

Hereinafter, the edge collecting electrode according to the first embodiment to the third embodiment disclosed in this specification will be described in detail with reference to the drawings.

First Embodiment—Edge Collecting Electrode Connected to the Outermost Finger Electrode Through the Finger Electrode and the Branched Electrode Hereinafter, a solar cell having an edge collecting electrode according to the first embodiment disclosed in this specification and a solar cell module including the solar cell will be described with reference to FIGS. 3 and 4.

Specifically, the first embodiment disclosed in this specification shows a case where the edge collecting electrode is connected to both at least one finger electrode selected from among the plurality of finger electrodes and the branched electrode.

That is, the first embodiment shows a case where one edge collecting electrode is connected to the bus electrode by using both the finger electrode and the branched electrode as intermediate electrodes.

Figure 3:
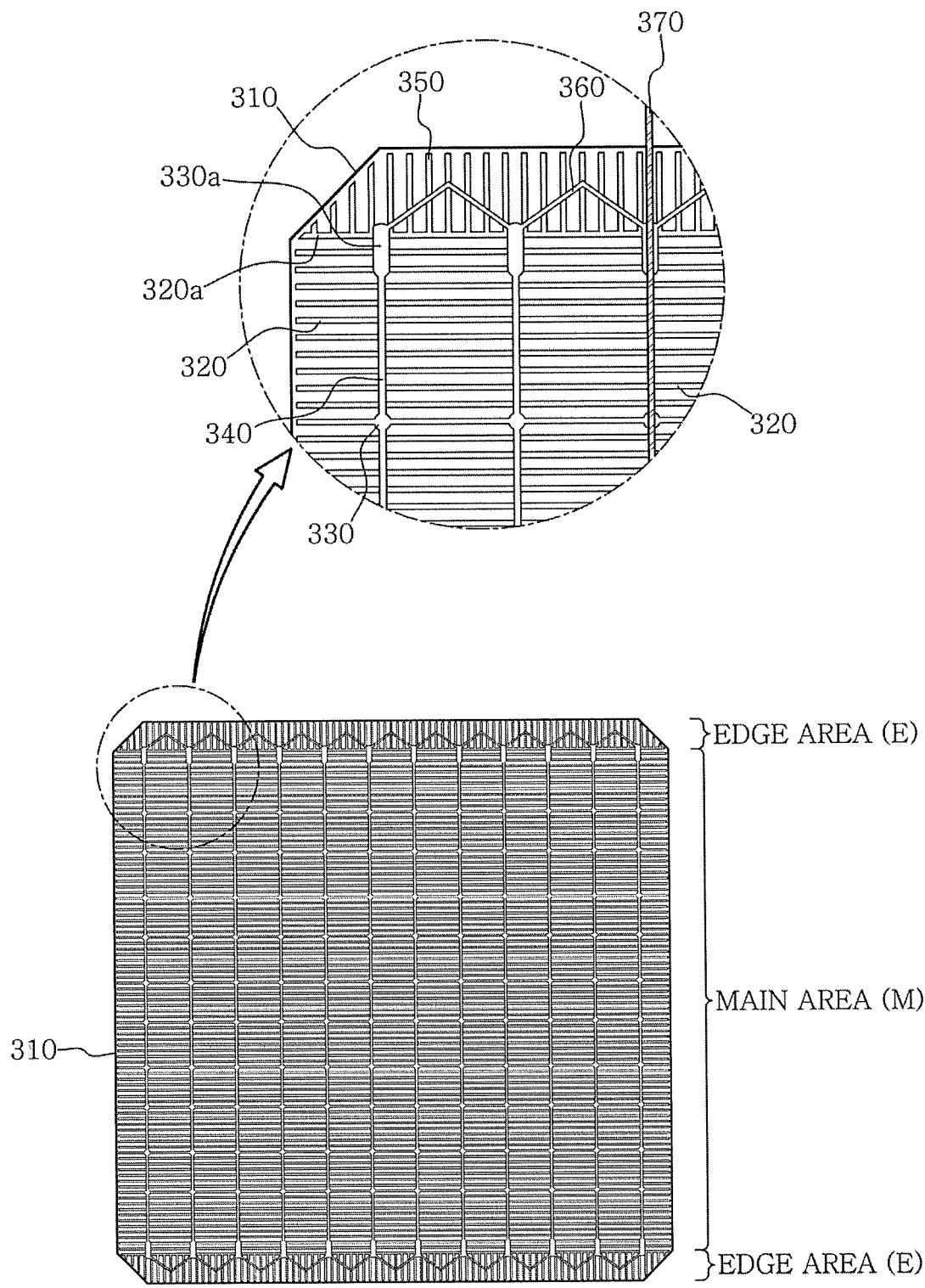
FIG. 3 is a plan view showing a solar cell having an edge collecting electrode according to the first embodiment disclosed in this specification.

FIG. 3 is a plan view showing a solar cell having an edge collecting electrode according to the first embodiment disclosed in this specification.

Referring to FIG. 3, the solar cell 10 having an edge collecting electrode according to the technique disclosed in this specification may include a semiconductor substrate 310 having a p-n junction.

Finger electrodes 320 may be provided to a front surface and a rear surface of the substrate 310, respectively. The finger electrode 320 provided to the front surface of the substrate 310 collects electrons generated by photoelectric transformation, and the finger electrode (not shown) provided to the rear surface of the substrate 310 collects holes generated by photoelectric transformation, or vice versa. The solar cell is classified into a front electrode type, a back electrode type, or the like depending on the arrangement of electrodes, and is classified into a front surface light receiving type, a double-sided light receiving type, or the like depending on the solar light receiving type. The solar cell according to the technology disclosed in this specification is not limited in shape as long as it has a p-n junctions that enable photoelectric transformation. In addition, a divided cell in which a typical solar cell is divided into a plurality of cells may also be applied to the solar cell or the solar cell module according to the technology disclosed in this specification. The term "divided cell" disclosed in this specification refers to that a solar cell (hereinafter, referred to as a "unit cell") is divided into a plurality of parts. A normal solar cell, namely a normal unit cell, refers to a solar cell in which a p-n junction structure and an electrode structure are completed by applying a solar cell process to a silicon substrate having a width and length of 6 inches (about 156 mm×156 mm), and the 'divided cell' of the present disclosure refers to a cell in which the unit cell is divided into a plurality of equal parts. The unit cell may use a silicon substrate of 5 to 8 inches in length and width, besides the silicon substrate of 6 inches in width and length. Also, the "divided cell" may mean a solar cell having an area corresponding to the divided cell obtained from the unit cell described above. In this case, the 'divided cell' means a solar cell completed by applying a solar cell process onto a silicon substrate having an area corresponding to the divided cell obtained from the unit cell.

Since the 'divided cell' is obtained by dividing a cell in which the solar cell manufacturing process is completed, the divided cell has a p-n junction structure and an electrode structure in a completed form, like the unit cell.

In addition, the divided cell in which a typical solar cell is divided into a plurality of parts may also be applied to the solar cell or the solar cell module according to the technology disclosed in this specification.

For reference, if a front surface light-receiving solar cell is configured, the finger electrode provided to the rear surface of the substrate may have a plate shape like an Al electrode that induces formation of a rear surface field. For convenience of description, the following description will be based on the solar cell 10 in which the same type of finger electrode 320 is provided to the front surface and the rear surface of the substrate 310.

A plurality of finger electrodes 320 may be provided to the front surface or the rear surface of the substrate 310, and the plurality of finger electrodes 320 may be arranged so as to be spaced apart in parallel.

In addition, on the substrate 310, a plurality of conductive pads 330 may be arranged so as to be spaced apart in a direction crossing (or, orthogonal to) the finger electrode 320. Each conductive pad 330 may be connected to the finger electrode 320 at the provided position, and the arrangement direction of the columns formed by the plurality of conductive pads 330 may be identical or similar to the direction in which the interconnector 360 (see FIG. 4) described later is disposed.

The interconnector 360 may be disposed on the conductive pad 330, and the arrangement direction of the interconnectors 360 may be the same as the arrangement direction of the columns formed by the plurality of conductive pads 330, and cross (or, be orthogonal to) the arrangement direction of the finger electrodes 320.

The conductive pad 330 may serve to transfer electrons or holes collected by the finger electrode 320 to the interconnector 360, and the interconnector 360 may serve to receive carriers collected by the finger electrode 320 through the conductive pad 330 and transmit the carriers to an external system or power storage device.

Meanwhile, in another embodiment, a bus bar electrode 340 may be further provided. In this case, the bus bar electrode 340 is provided in a direction orthogonal to the plurality of collection electrodes 320, and the conductive pad 330 is provided on the bus bar electrode 340 at a point where the bus bar electrode 340 and the collection electrodes 320 intersect. In another embodiment, by providing the bus bar electrode 340 between the conductive pad 330 and the conductive pad 330, it is also possible to have a structure in which the collection electrode 320 and the bus bar electrode 340 are connected to the conductive pad 330. However, in the above embodiments, commonly, the interconnector 370 is connected to the conductive pad 330.

As described above, a configuration including at least one of the conductive pad 330 and the bus bar electrode 340 may be referred to as a bus electrode.

The structures of the finger electrode 320, the conductive pad 330 and the interconnector 370 have been described above. Meanwhile, the semiconductor substrate 310 is divided into a 'main area M' and an 'edge area E' based on a plane.

Here, the main area M and the edge area E are as described above, and as an additional meaning, the 'main area M' may mean a region provided with a coupling structure of the finger electrode 320, the conductive pad 330 and the interconnector 360, the 'edge area E' may mean an edge portion of the solar cell provided to one side or both sides of the main area M. Here, the edge collecting electrode 350 may be provided in the edge area E.

Referring to FIG. 3, the plurality of finger electrodes 320 are arranged so as to be spaced apart in parallel in the main area M, and according to the first embodiment disclosed in this specification, each of the plurality of edge collecting electrodes 350 may be connected to the bus electrode (the bus bar electrode 340 (particularly, a terminal portion thereof) or the outermost conductive pad 330a) by using both a finger electrode selected from the plurality of finger electrodes 320 and the branched electrode as an intermediate electrode.

In particular, FIG. 3 shows the case where the selected finger electrode is the outermost finger electrode 320a.

Accordingly, the plurality of finger electrode 320 are arranged so as to be spaced apart in parallel in the main area M, and the plurality of edge collecting electrodes 350 are connected to the finger electrode 320 (referred to as an outermost finger electrode 320a) provided at an outermost location of the main area M. The locations where the plurality of edge collecting electrodes 350 are provided may be referred to as the edge area E as described above.

The plurality of edge collecting electrodes 350 connected to the outermost finger electrode 320a and provided in the edge area E may basically serve to collect carriers generated by photoelectric transformation, like the collection electrode 320. In addition, the interconnector 360 may be disposed to a region between the edge collecting electrode 350 and the edge collecting electrode 350.

The technique disclosed in this specification proposes a technology capable of solving the cell crack phenomenon and the adhesion weakening phenomenon by moving the outermost contact point to the inner area of the solar cell and also preventing deterioration of the solar cell efficiency such as the carrier collecting efficiency by providing the edge collecting electrodes in the region between the outermost contact point and the edge of the solar cell and disposing the interconnector between the edge collecting electrodes.

The technique disclosed in this specification proposes a structure in which a finger electrode 320 is provided in the main area M and also a plurality of edge collecting electrodes 350 connected to the outermost finger electrode 320a in the main area M are provided in the edge area E.

Similar to the finger electrode 320 of the main area M that is connected to the conductive pad 330, the outermost finger electrode 320a is also connected to a conductive pad 330 (an outermost conductive pad 330a), and the interconnector 360 may be connected on the outermost conductive pad 330a.

Since the outermost conductive pad 330a is a conductive pad 330 disposed at the outermost side of the main area M, the contact point of the outermost conductive pad 330a and the interconnector 360 may be referred to as a last contact point made by the conductive pad 330 and the interconnector 360 on the substrate 310, and hereinafter, this contact pad may be called an outermost contact point. Meanwhile, as described above, a structure in which the conductive pad 330 is omitted is also possible, and in this case, the outermost contact point may mean a contact point between the interconnector and the outermost collection electrode or a contact point between the interconnector and the outermost bus bar electrode.

By using the configuration in which the outermost contact point is moved to the inner area of the substrate 310 as much as the distance of the edge area E, it is possible to prevent cracking and improve the coupling force of the interconnector 360 as described above.

In addition, since the plurality of edge collecting electrodes 350 are provided in the edge area E and the plurality of edge collecting electrodes 350 form a structure connected to the outermost finger electrode 320a, it is possible to improve the carrier collection efficiency in the edge area E and the carrier collection efficiency in the main area M by the collection electrode 320.

In addition, the technique disclosed in this specification is further provided with a branched electrode 360. The branched electrode 360 connects the plurality of edge collecting electrodes 350 integrally, and one end of the branched electrode 360 is connected to the outermost conductive pad to electrically connect the edge collecting electrode 350 and the outermost conductive pad.

The branched electrode 360 may be arranged to cross the plurality of edge collecting electrodes 350, and according to this structure, the path between the edge collecting electrode 350 and the outermost conductive pad is shortened, thereby reducing the recombination rate of carriers.

The branched electrode 360 may be modified in various forms on the premise that it connects the plurality of edge collecting electrodes 350 and its one end is connected to the outermost conductive pad. In one embodiment, the connection collection electrode 360 is arranged in a bent shape between neighboring outermost conductive pads to connect the plurality of edge collecting electrodes 350 and to allow both ends thereof to be connected to the outermost conductive pads, respectively.

Figure 4A:
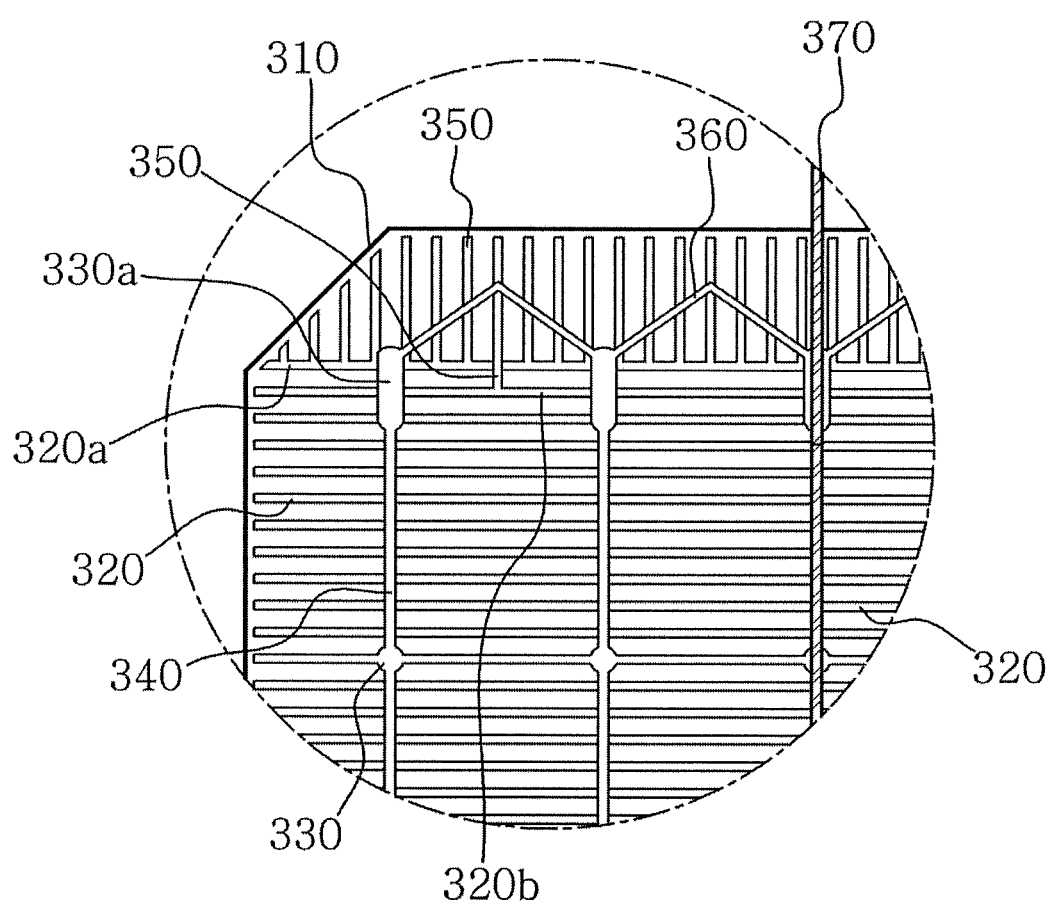
FIGS. 4A and 4B are reference views showing an arrangement form of the edge collecting electrodes according to the first embodiment disclosed in this specification.
Figure 4B:
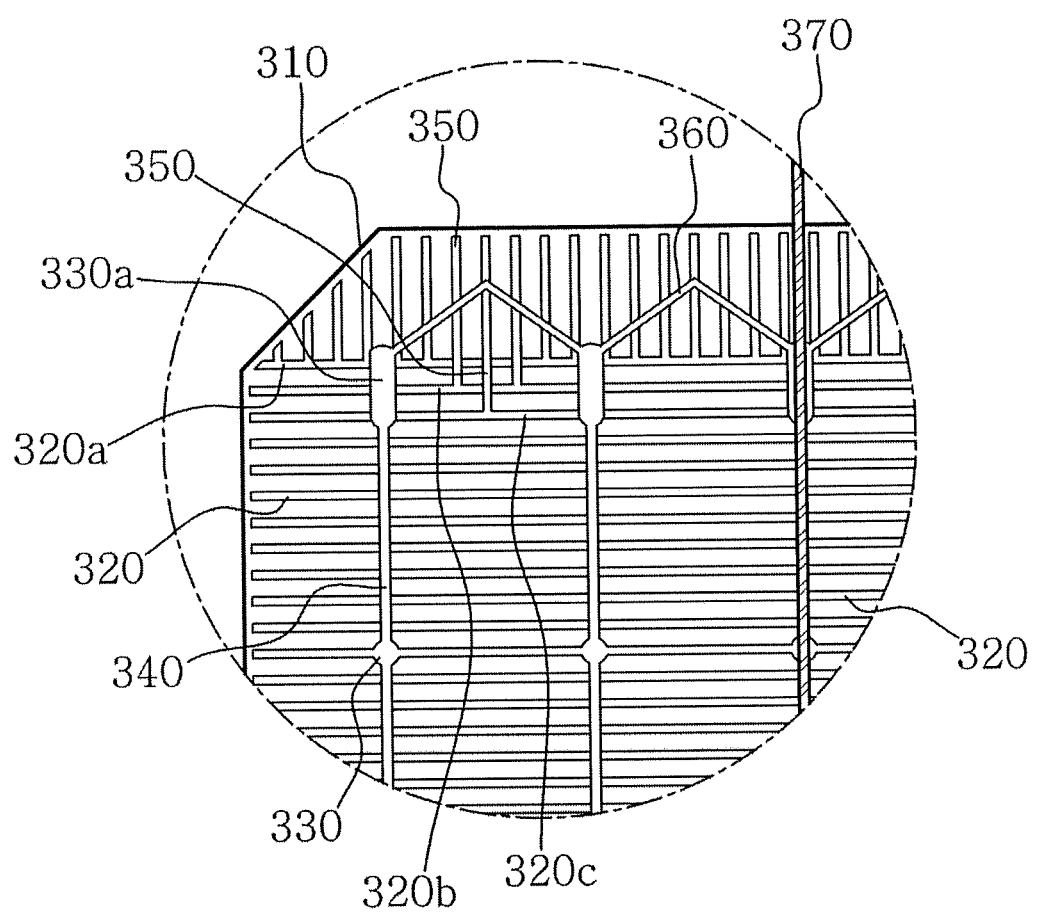

FIGS. 4A and 4B are reference views showing the form in which the edge collecting electrodes is connected to the finger electrode according to the first embodiment disclosed in this specification.

FIG. 4A shows the case where the selected finger electrode is selected from two finger electrodes 320a, 320b located at the outermost side of the main area.

In addition, FIG. 4B shows the case where the selected finger electrode is selected from three finger electrodes 320a, 320b, 320c located at the outermost side of the main area.

In the case of FIGS. 4A and 4B, the role of the outermost finger electrode 320a described above may be performed by two or three finger electrodes located at the outermost side of the main area.

The plurality of edge collecting electrodes 350 is preferably provided in a direction orthogonal to the selected finger electrode 320, but the plurality of edge collecting electrodes 350 may also be arranged along a diagonal line or the like on the premise that a space in which the interconnector 370 is disposed is provided between the edge collecting electrodes 350.

Second Embodiment—Edge Collecting Electrode Connected to the Bus Electrode Through the Branched Electrode Hereinafter, a solar cell having an edge collecting electrode according to the second embodiment disclosed in this specification and a solar cell module including the same will be described in detail with reference to FIG. 5.

Specifically, the second embodiment disclosed in this specification shows a case where the edge collecting electrode is connected only to the branched electrode.

That is, the second embodiment shows a case where one edge collecting electrode is connected to the bus electrode by using only the branched electrode as an intermediate electrode.

Figure 5:
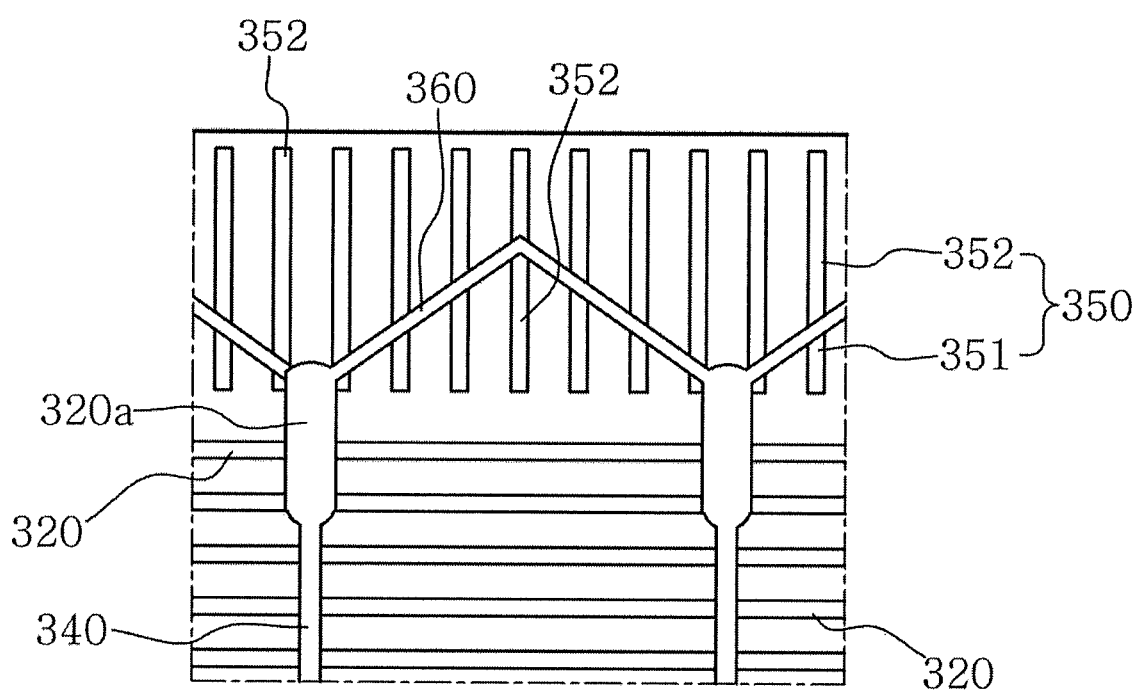
FIG. 5 is a reference view showing an edge collecting electrode according to the second embodiment disclosed in this specification.

FIG. 5 is a reference view showing an edge collecting electrode according to the second embodiment disclosed in this specification.

Referring to FIG. 5, the structures of the edge collecting electrode and the branched electrode may be designed differently. The first embodiment discloses a structure in which the plurality of edge collecting electrodes 350 are provided in the edge area, the plurality of edge collecting electrodes 350 are connected to the selected finger electrode (for example, one to three outermost finger electrodes, 320a to 320c) in the main area, the plurality of edge collecting electrodes 350 are also connected to the branched electrode 360, and both ends of the branched electrode 360 are connected to the bus electrode (for example, the outermost conductive pad 330a). However, according to the second embodiment, the edge collecting electrode 350 may be connected to the bus electrode by using only the branched electrode 360 as an intermediate electrode.

Third Embodiment—Edge Collecting Electrode Connected to the Bus Electrode by Using at Least One of the Finger Electrode and the Branched Electrode as an Intermediate Electrode Hereinafter, a solar cell having an edge collecting electrode according to the third embodiment disclosed in this specification and a solar cell module including the same will be described in detail with reference to FIG. 6.

Specifically, the third embodiment disclosed in this specification shows a case where the edge collecting electrode is connected to at least one of the finger electrode and the branched electrode.

Figure 6:
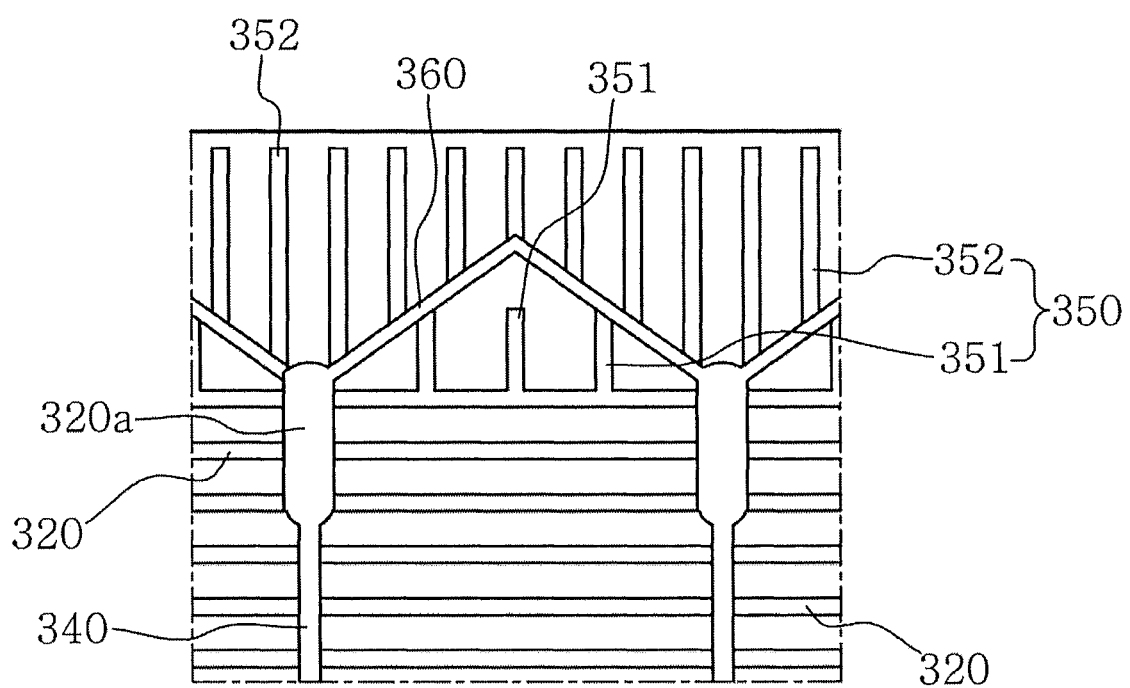
FIG. 6 is a reference view showing an edge collecting electrode according to the third embodiment disclosed in this specification.

FIG. 6 is a reference view showing an edge collecting electrode according to the third embodiment disclosed in this specification.

Referring to FIG. 6, as described above, the edge collecting electrode according to the third embodiment shows a case where at least one of the finger electrode and the branched electrode is used as an intermediate electrode and connected to the bus electrode (for example, the outermost conductive pad 330a).

Additionally, the edge collecting electrodes shown in FIG. 6 may be classified as follows.

Here, the branched electrode 360 is partially or entirely disposed in the edge area, and both ends of the branched electrode 360 may be connected to the bus electrode (for example, the outermost conductive pad 330a).

In this state, the plurality of edge collecting electrodes 350 are provided in the edge area, and the edge collecting electrodes may be classified into a first edge collecting electrode 351 and a second edge collecting electrode 352 in detail.

The first edge collecting electrode 351 and the second edge collecting electrode 352 are functionally different and may be distinguished by their locations. Based on the branched electrode 360, the first edge collecting electrode 351 may be provided below the branched electrode 360 and the second edge collecting electrode 352 may be provided above the branched electrode.

Here, the upper portion of the branched electrode 360 may refer to a direction toward the edge of the solar cell substrate, and the lower portion of the branched electrode 360 may refer to a direction toward the main area.

A plurality of first edge collecting electrodes 351 may be provided below the branched electrode 360, and a plurality of second edge collecting electrodes 352 may be provided above the branched electrode 360. The first edge collecting electrode 351, the second edge collecting electrode 352 and the branched electrode 360 may be provided in the edge area, similar to the combination of the edge collecting electrode 350 and the branched electrode 360 of the former embodiment, and serve to improve the carrier collecting efficiency in the edge area.

The plurality of second edge collecting electrodes 352 may be connected to the branched electrode 360.

Also, the plurality of first edge collecting electrodes 351 may or may not be connected to the branched electrode 360. In addition, the plurality of first edge collecting electrodes 351 may be connected to the branched electrode 360 or the finger electrode 320 in the main area, or to both the branched electrode 360 and the finger electrode 320 in the main area.

When the plurality of first edge collecting electrodes 351 are connected to the finger electrode 320 in the main area, the plurality of first edge collecting electrodes 351 may be connected to the selected finger electrode (for example, one to three outermost finger electrodes) among the finger electrodes in the main area.

Meanwhile, the number of first edge collecting electrodes 351 provided below the branched electrode 360 and the number of second edge collecting electrodes 352 provided above the branched electrode 360 may be the same or different from each other. As the first edge collecting electrode 351 is closer to the main area than the second edge collecting electrode 352, the number of first edge collecting electrodes 351 may be smaller than the number of second edge collecting electrodes 352. In addition, the width between the first edge collecting electrode 351 and the first edge collecting electrode 351 and the width between the second edge collecting electrode 352 and the second edge collecting electrode 352 may be designed differently.

Fourth Embodiment—Edge Collecting Electrodes Whose One Ends at the Edge of the Solar Cell are Connected to Each Other Hereinafter, a solar cell having an edge collecting electrode according to the fourth embodiment disclosed in this specification and a solar cell module including the same will be described in detail with reference to FIGS. 7A and 7B.

Specifically, the fourth embodiment disclosed in this specification shows a case where one ends of the edge collecting electrodes are connected to each other.

Figure 7A:
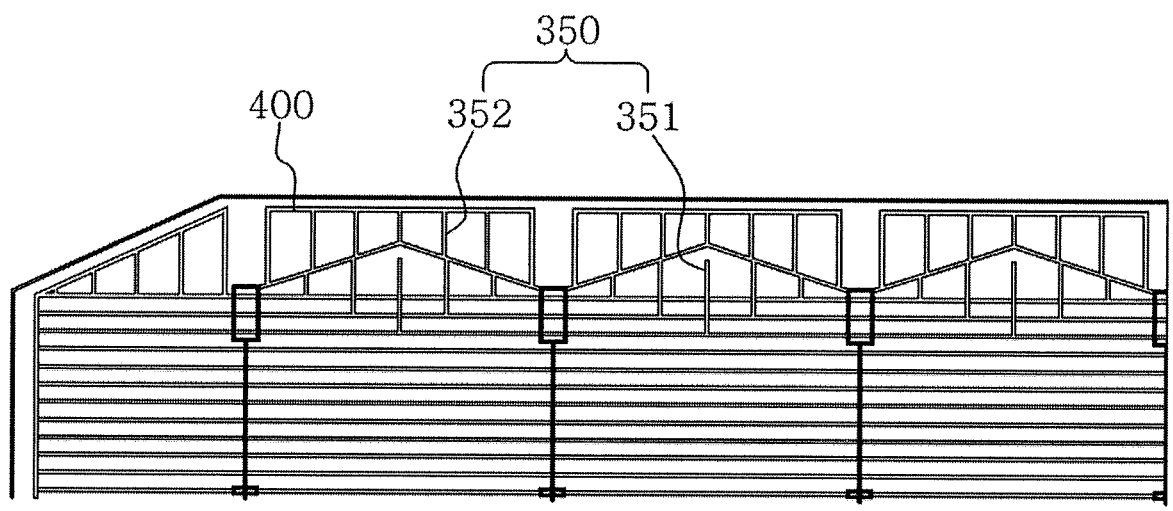
FIGS. 7A and FIG. 7B are reference views showing an edge collecting electrode according to the fourth embodiment disclosed in this specification.
Figure 7B:
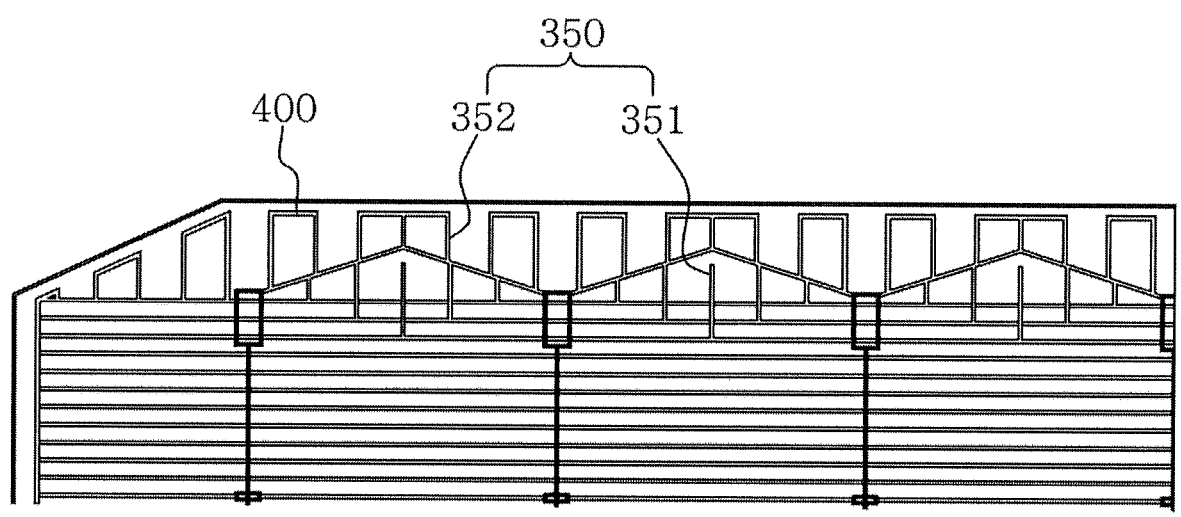

FIGS. 7A and FIG. 7B are reference views showing an edge collecting electrode according to the fourth embodiment disclosed in this specification.

In this specification, the electrode connecting the ends of the edge collecting electrodes is referred to as an 'edge connecting electrode' 400.

Referring to FIG. 7A, one ends of the edge collecting electrodes 350, particularly the second edge collecting electrodes 352 in FIG. 7A, may be connected to each other by the edge connecting electrode 400. The ends may be ends toward the edge of the solar cell.

FIG. 7B shows a case where the ends of the second edge collecting electrodes 352 are connected by two or three ends.

According to the technique disclosed in this specification, in FIGS. 7A and 7B, commonly, the edge collecting electrodes at both sides in which the interconnectors are disposed may not be connected to each other.

Fifth Embodiment—Branched Electrode Disposed Over the Main Area and the Edge Area Hereinafter, a solar cell having an edge collecting electrode according to the fifth embodiment disclosed in this specification and a solar cell module including the same will be described in detail with reference to FIG. 8.

Specifically, the fifth embodiment disclosed in this specification shows a case where the branched electrode 360 is disposed over the main area and the edge area.

Figure 8:
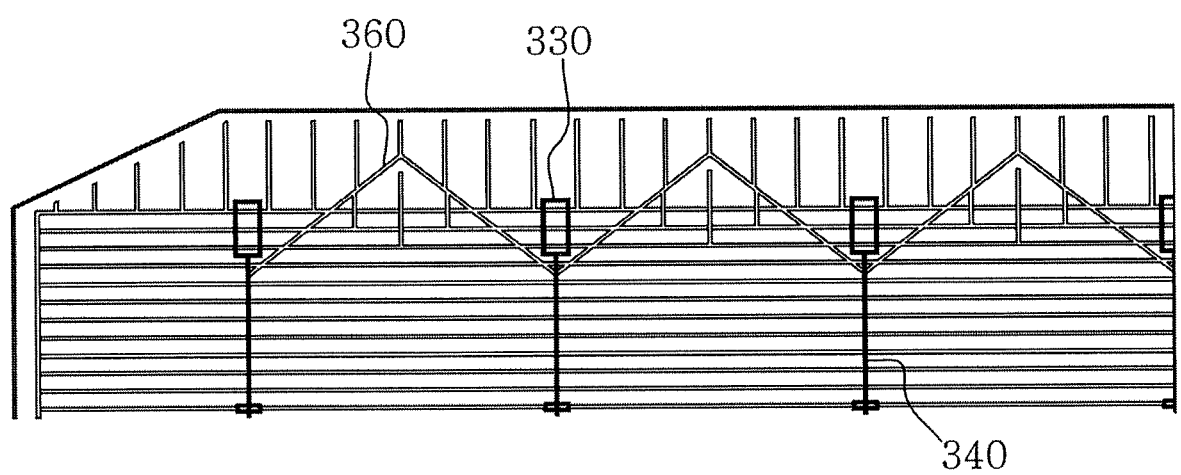
FIG. 8 is a reference view showing an edge collecting electrode according to the fifth embodiment disclosed in this specification.

FIG. 8 is a reference view showing an edge collecting electrode according to the fifth embodiment disclosed in this specification.

Referring to FIG. 8, the bus electrode may include the bus bar electrode 340 and the conductive pad 330. In addition, the branched electrode 360 may be disposed over the main area and the edge area by being connected to the bus bar electrode 340 rather than the conductive pad 330 (particularly, the outermost conductive pad).

Heretofore, the solar cell having an edge collecting electrode according to the first to third embodiments disclosed in this specification has been described.

Additionally, according to the technique disclosed in this specification, the length from the end of the edge collecting electrode located at the inner side of the solar cell, except for the edge thereof, among the plurality of edge collecting electrodes to the crossing point of the finger electrode located at the outermost side of the main area and the edge collecting electrode may be smaller than the gap by which the interconnectors are spaced and greater than ½ of the gap.

In addition, according to the technique disclosed in this specification, in the case that the ribbon interconnector is a wire-type interconnector (referred to as a wire interconnector), assuming that the diameter of the wire interconnector is a and the gap between the finger electrodes is b, considering that the wire is not attached to the edge collecting electrode and the resistance loss caused by the surface resistance of the emitter should be minimized, a desirable distance c between the edge collecting electrodes may have a relationship of 'a<(c=b)'.

In another embodiment, when it is required to reduce the consumption of the electrode paste for cost reduction, the distance c may be 'a, b<c'.

In still another embodiment, in the aspect of maintaining the collection efficiency in the edge area at a predetermined level or higher in the electrode forming process, the distance c may be formed in a relationship of 'a<c≤b'.

Heretofore, the solar cell having an edge collecting electrode according to the technology disclosed in this specification has been described above. Next, a solar cell module including the solar cell having an edge collecting electrode according to the technology disclosed in this specification will be described.

Figure 9:
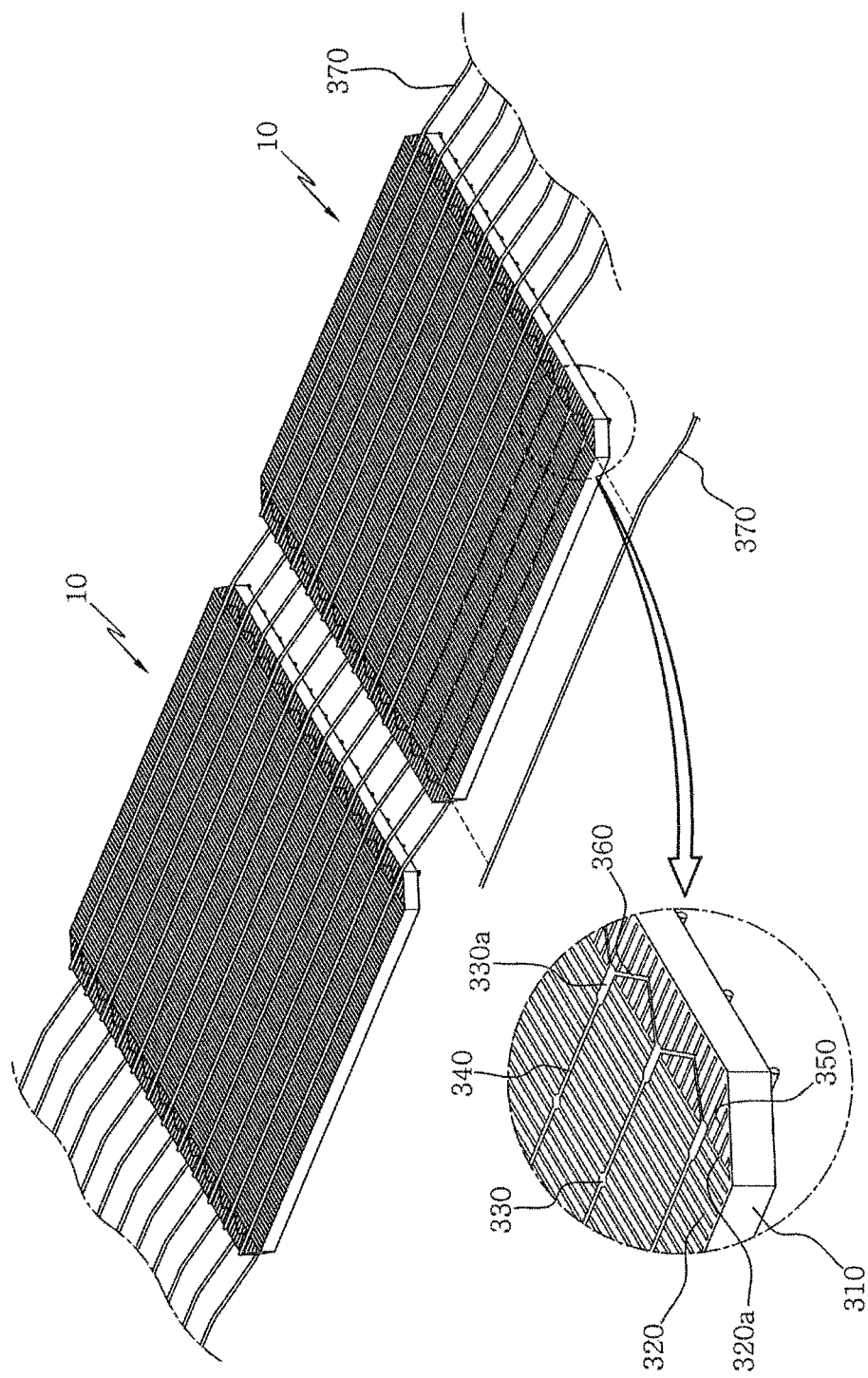
FIG. 9 is a perspective view showing a solar cell module according to the technique disclosed in this specification.
Figure 10:
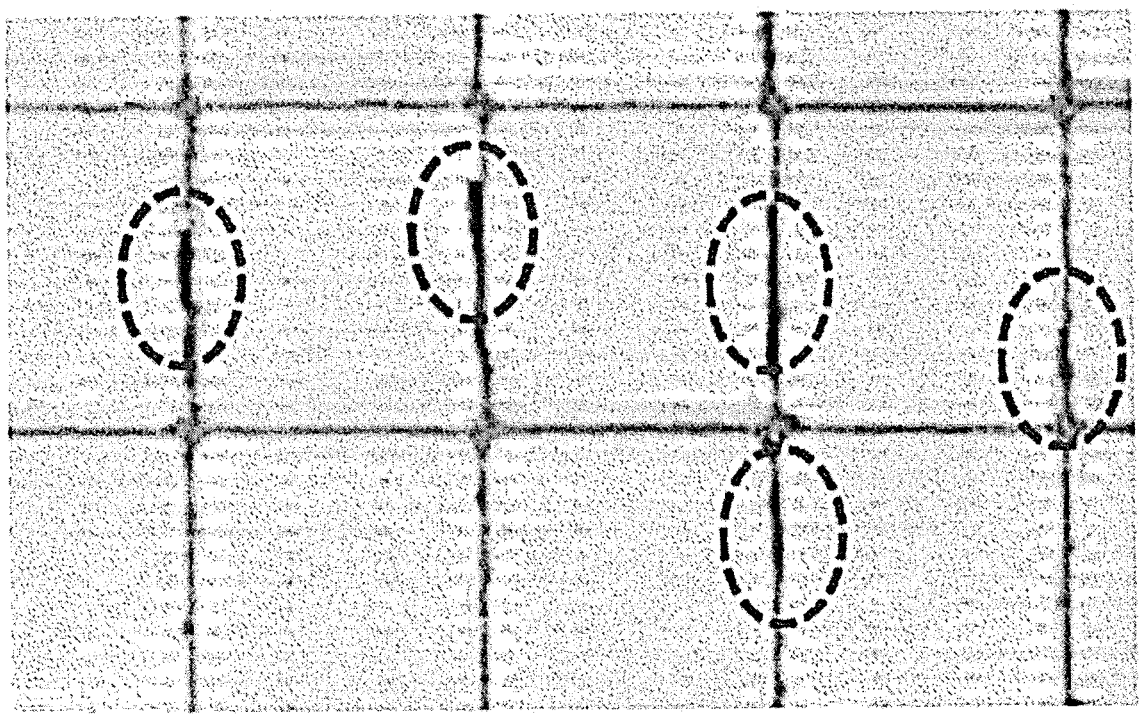
FIG. 10 is an EL image showing that cracks occur at edge portions of the solar cell.

FIG. 9 is a perspective view showing a solar cell module according to the technique disclosed in this specification.

Referring to FIG. 9, the solar cell module according to the technology disclosed in this specification may include a plurality of solar cells. For example, the solar cell module according to the technology disclosed in this specification may be configured to include a first solar cell 10 and a second solar cell 20 disposed adjacent to each other. Each of the solar cells 10, 20 may have a structure of the solar cell having an edge collecting electrode 350 according to the technology disclosed in this specification.

The plurality of solar cells 10, 20 may be electrically connected by the interconnector 370. Specifically, the interconnector 370 is connected by forming contact points with the plurality of conductive pads 330 provided at the front surface of the first solar cell, and the interconnector 370 is extended and bent from the upper edge of the first solar cell 10 toward the lower edge of the second solar cell, and may be connected by forming contact points with the plurality of conductive pads 330 provided at the rear surface of the second solar cell 20. Meanwhile, the interconnector applied to the technology disclosed in this specification is not limited to its shape. As a preferred embodiment, a wire interconnector may be applied, but a ribbon interconnector may also be applied.

The edge area E having the edge collecting electrode 350 may be provided to the front surface of the first solar cell 10 and the rear surface of the second solar cell 20, respectively. In addition, on the front surface of the first solar cell, the interconnector 370 may form an outermost contact point with the outermost conductive pad 330a, and the interconnector 370 forming the outermost contact point may be disposed between the edge collecting electrodes 350 in the edge area E and extend toward the edge of the first solar cell. At the rear surface of the second solar cell, the interconnector 370 also forms an outermost contact point with the outermost conductive pad 330a, and the interconnector 370 forming the outermost contact point may be disposed between the edge collecting electrodes 350 in the edge area E and extend toward the edge of the second solar cell.

REFERENCE SYMBOLS

| 10: | first solar cell | 20: | second solar cell |
|---|---|---|---|
| 310: | semiconductor substrate | 320: | collection electrode |
| 320a: | outermost collection electrode | 330: | conductive pad |
| 330a: | outermost conductive pad | 340: | bus bar electrode |
| 350: | edge collecting electrode | 360: | connection collection electrode |
| 370: | interconnector | | |
| M: | main area | A: | edge area |

INDUSTRIAL APPLICABILITY

Since the outermost contact point of the interconnector is located at an inner side of the substrate as much as the edge area from the edge of the substrate, it is possible to prevent cracking by the interconnector and improve the adhesion of the interconnector by relieving the elastic force of the interconnector.

In addition, since the edge collecting electrode disposed in a direction crossing the collection electrode in the main area is provided in the edge area, it is possible to guide the arrangement of the interconnector and improve the carrier collection efficiency.

Additionally, by electrically connecting the plurality of edge collecting electrodes provided in the edge area to the bus electrode (for example, the outermost conductive pad) through the branched electrode, the carrier travel distance in the edge area may be shortened to prevent carriers from being recombined and disappearing.

The invention claimed is:

1. A solar cell, comprising:
    a semiconductor substrate having a main area and an edge area;
    a plurality of finger electrodes provided on any one of a front surface and a rear surface of the semiconductor substrate and arranged in the main area so as to be spaced apart in parallel;
    a wire interconnector consisting of a conductive wire having a diameter of 200 to 600 μm for electrically connecting the solar cell to neighboring solar cells, the wire interconnector having an outermost contact point with the solar cell located in the main area at or near a boundary between the main area and the edge area of the semiconductor substrate;
    a bus electrode arranged in a direction crossing the finger electrodes and connected to the wire interconnector that electrically connects neighboring solar cells;
    a plurality of edge collecting electrodes provided in the edge area and spaced apart in parallel, wherein the wire interconnector is disposed between two adjacent edge collecting electrodes; and
    branched electrodes partially or entirely located in the edge area and connected to the bus electrode,
    wherein the edge area is provided at one end side or both end sides of the semiconductor substrate,
    and
    the plurality of edge collecting electrodes are electrically connected to the bus electrode through at least one finger electrode selected from the plurality of finger electrodes and at least one of the branched electrodes, wherein the selected at least one finger electrode is selected from three finger electrodes located at an outermost side of the main area adjacent the edge collecting electrodes, and all of the plurality of edge collecting electrodes are arranged orthogonal to the plurality of finger electrodes in the main region, and each of the plurality of edge collecting electrodes is directly connected to at least one of the plurality of finger electrodes located in the main region.

2. The solar cell according to claim 1, wherein the bus electrode is configured to include a bus bar electrode disposed in the direction crossing the finger electrodes, and a plurality of conductive pads spaced apart in the direction crossing the finger electrodes.

3. The solar cell according to claim 2, wherein the plurality of conductive pads are arranged in a direction orthogonal to the finger electrodes.

4. The solar cell according to claim 2, wherein the bus bar electrode is provided between the plurality of conductive pads.

5. The solar cell according to claim 2, wherein the bus bar electrode is provided in a direction orthogonal to the plurality of finger electrodes, and the plurality of conductive pads are provided on the bus bar electrode at points where the bus bar electrode and the finger electrodes intersect.

6. The solar cell according to claim 2, wherein the bus bar electrode is provided between the plurality of conductive pads, and the plurality of finger electrodes and the bus bar electrode are connected to the plurality of conductive pads.

7. The solar cell according to claim 1, wherein, among the plurality of edge collecting electrodes, edge collecting electrodes located at a corner of the edge area of the solar cell have different lengths from edge collecting electrodes located in a central portion of the edge area.

8. The solar cell according to claim 1, wherein at least one of the plurality of edge collecting electrodes is connected to a conductive pad located at an outermost side of the main area.

9. The solar cell according to claim 1, wherein the branched electrodes are disposed to cross the plurality of edge collecting electrodes.

10. The solar cell according to claim 1, wherein the edge collecting electrodes include first edge collecting electrodes located below the branched electrodes, and second edge collecting electrodes located above the branched electrodes.

11. The solar cell according to claim 10, wherein the first edge collecting electrodes are connected to at least one of the branched electrodes and the finger electrodes.

12. The solar cell according to claim 10, wherein the second edge collecting electrodes are connected to the branched electrodes.

13. The solar cell according to claim 10, wherein the number of the first edge collecting electrodes is different from the number of the second edge collecting electrodes.

14. The solar cell according to claim 10, wherein the number of the first edge collecting electrodes is smaller than the number of the second edge collecting electrodes.

15. The solar cell according to claim 10, wherein the space between the first edge collecting electrodes is different from the space between the second edge collecting electrodes.

16. A solar cell module, comprising:
a first solar cell and a second solar cell arranged adjacent to each other, wherein the first solar cell and the second solar cell each include a semiconductor substrate having a main area and an edge area; and
a wire interconnector consisting of a conductive wire having a diameter of 200 to 600 μm configured to electrically connect a conductive pad at a front surface of the first solar cell and a conductive pad at a rear surface of the second solar cell, the wire interconnector having an outermost contact point with each of the first and second solar cells located in the main area of the solar cell at or near a boundary between the main area and the edge area of the solar cell,
wherein the first solar cell or second solar cell includes a plurality of finger electrodes provided on any one of a front surface and a rear surface of the semiconductor substrate and arranged in the main area so as to be spaced apart in parallel, a bus electrode arranged in a direction crossing the finger electrodes and connected to the wire interconnector that electrically connects the first and second solar cells, a plurality of edge collecting electrodes provided in the edge area and spaced apart in parallel, wherein the wire interconnector is disposed between two adjacent edge collecting electrodes, and branched electrodes partially or entirely located in the edge area and connected to the bus electrode,
wherein the edge area is provided at one end side or both end sides of the semiconductor substrate,
the plurality of edge collecting electrodes are electrically connected to the bus electrode through at least one finger electrode selected from the plurality of finger electrodes and at least one of the branched electrodes, wherein the selected at least one finger electrode is selected from three finger electrodes located at an outermost side of the main area adjacent the edge collecting electrodes, and
all of the plurality of edge collecting electrodes are arranged orthogonal to the plurality of finger electrodes located at an outermost side of the main region, and each of the plurality of edge collecting electrodes is directly connected to at least one of the plurality of finger electrodes located in the main region.

* * * * *